United States Patent [19]

Vasudev et al.

[11] Patent Number: 5,081,062
[45] Date of Patent: Jan. 14, 1992

[54] MONOLITHIC INTEGRATION OF SILICON ON INSULATOR AND GALLIUM ARSENIDE SEMICONDUCTOR TECHNOLOGIES

[76] Inventors: Prahalad Vasudev, 290 Autumnwood St., Thousand Oaks, Calif. 91360; Irnee J. D'Haenens, 131 Paradise Cove, Malibu, Calif. 90265

[21] Appl. No.: 366,973

[22] Filed: Jun. 14, 1989

Related U.S. Application Data

[63] Continuation-in-part of Ser. No. 90,307, Aug. 27, 1987, abandoned.

[51] Int. Cl.$^5$ .................. H01L 21/20; H01L 21/203; H01L 29/161; C21D 1/10
[52] U.S. Cl. ...................................... 437/132; 437/21; 357/16

[56] References Cited

U.S. PATENT DOCUMENTS

| | | | |
|---|---|---|---|
| 3,855,009 | 12/1974 | Lloyd et al. | 437/26 |
| 3,900,345 | 8/1975 | Lesk | 437/24 |
| 3,976,511 | 8/1976 | Johnson | 437/26 |
| 4,177,084 | 12/1979 | Lau et al. | 437/24 |
| 4,230,505 | 10/1980 | Wu et al. | 437/26 |
| 4,317,686 | 3/1982 | Anand et al. | 357/49 |
| 4,448,632 | 5/1984 | Akasaka | 156/612 |
| 4,465,705 | 8/1984 | Ishihara et al. | 437/26 |
| 4,554,030 | 11/1985 | Haisma et al. | 156/612 |
| 4,559,091 | 12/1985 | Allen et al. | 437/107 |
| 4,561,916 | 12/1985 | Akiyama et al. | 156/612 |
| 4,587,717 | 5/1986 | Daniele et al. | 437/107 |
| 4,659,392 | 4/1987 | Vasudev | 437/24 |
| 4,693,759 | 9/1987 | Noguchi et al. | 437/24 |
| 4,699,688 | 10/1987 | Shastry | 156/613 |

OTHER PUBLICATIONS

Solid State Technology, Feb. 1983, pp. 104-109, "Recent Advances in Hetero-Epitaxial Silicon-on-Insulator Technology," Gupta and Vasudev.
Turner et al., "High Speed Photoconductive Detectors Fabrication in Heteroepitaxial GaAs Layers," Mat. Res. Soc. Symp. Proc., vol. 67, 1986, pp. 181-188.
Choi et al., "Monolithic Integration of Si and GaAs Devices," Mat. Res. Soc. Symp. Proc., vol. 67, 1986, pp. 165-171.
Akiyama et al., "Growth of High Quality GaAs Layers on Si Substrates by MOCUD", Journal of Crystal Growth, vol. 77, 1986, pp. 490-497.
Wang, "Molecular Beam Epitaxial Growth ... of GaAs and AlGaAs on Si(100)", Appl. Phys. Lett., vol. 44, No. 12, Jun. 15, 1984, pp. 1149-1151.
Chang et al., "Growth of High Quality GaAs Layers Directly on Si Substrate by Molecular Beam Epitaxy", J. Vac. Sci. Technol. B5(3), May/Jun. 1987, pp. 815-818.

Primary Examiner—Olik Chaudhuri
Assistant Examiner—Loc Q. Trinh

[57] ABSTRACT

A semiconductor heterostructure includes separate, device quality regions of gallium arsenide and silicon layers on an insulating substrate such as aluminum oxide or silicon dioxide. The separate regions can be electrically isolated except for intended connections, permitting the fabrication of interrelated gallium arsenide and silicon semiconductor active devices on a single substrate. The device quality gallium arsenide is grown overlying the specially treated device quality silicon layer, by depositing a thin transition layer of gallium arsenide in low temperature growth, annealing it by solid phase epitaxy, and then depositing at a higher temperature a thicker epitaxial layer of gallium arsenide overlying the transition layer.

12 Claims, 3 Drawing Sheets

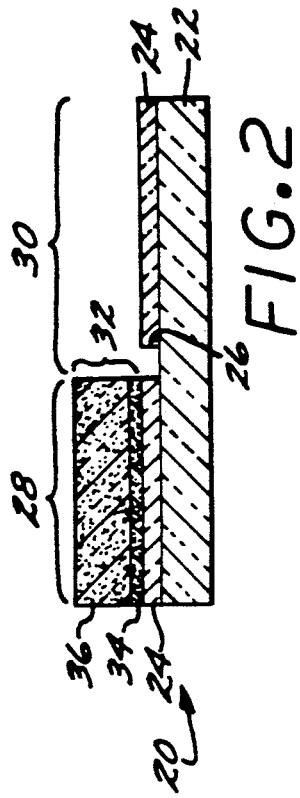
FIG. 1
FIG. 2
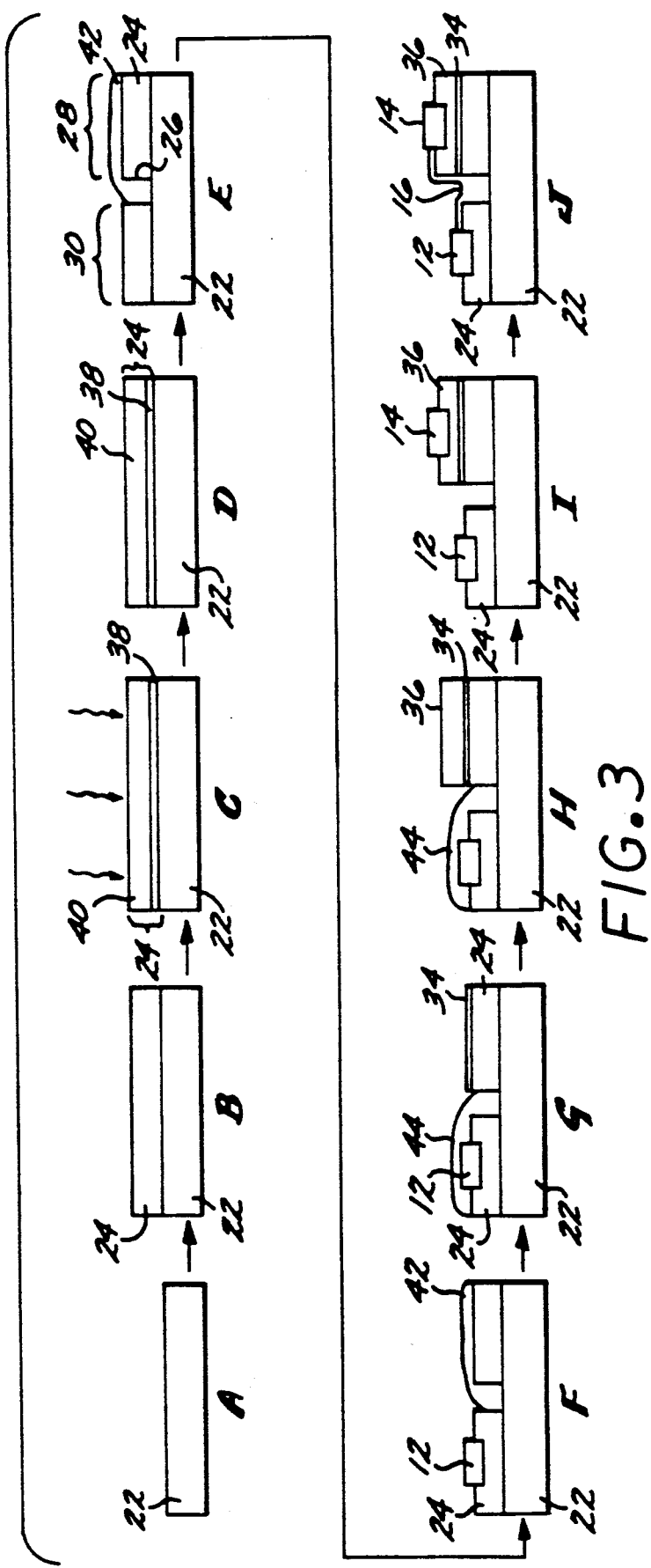
FIG. 3

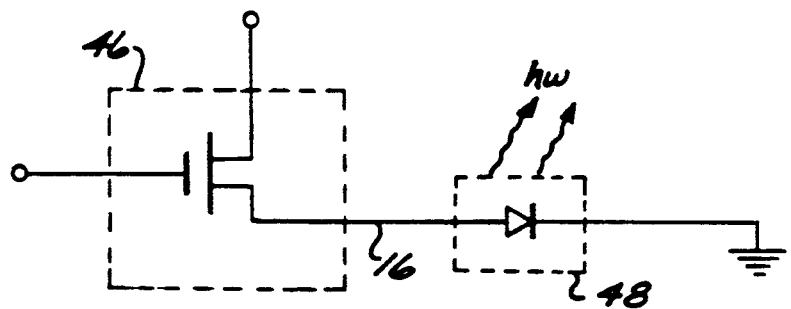
FIG.4
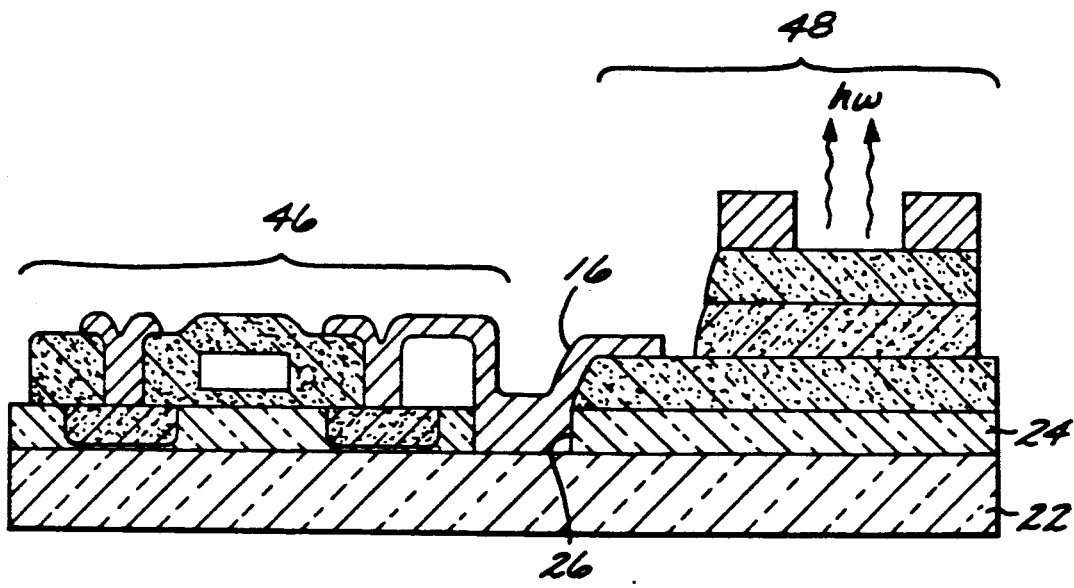
FIG.5
FIG.6
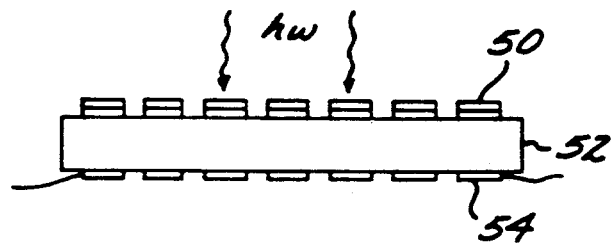

5,081,062

MONOLITHIC INTEGRATION OF SILICON ON INSULATOR AND GALLIUM ARSENIDE SEMICONDUCTOR TECHNOLOGIES

This application is a continuation-in-part of copending U.S. patent application Ser. No. 090,307, filed Aug. 27, 1987, now abandoned.

BACKGROUND OF THE INVENTION

This invention relates to electronic devices, and, more particularly, to integrated circuits that combine gallium arsenide and silicon device technologies on a single substrate.

Electronic technology has been developed to permit the construction of ever-smaller devices and arrays of devices. In integrated circuits, many miniaturized active and passive elements are placed upon a single substrate, that is often less than an inch square in size. The reduction in size permits an increase in speed of operation and a decrease in power consumption, and has led to the development of computers and other machinery having extraordinary capability.

Many of the miniature active electronic devices, such as transistors, that are formed on the substrate of an integrated device are fabricated from silicon and doped silicon. Such silicon-based technology has been advanced to submicron levels, so that thousands of devices can be packed onto a single substrate to achieve very high packing densities. Silicon devices are particularly effective for processing electronic signals having relatively low frequency, on the order of less than about 1 Gigahertz, and which do not produce optical signals, resulting in limitations on the applications of silicon-based integrated circuits.

Similar types of devices, but based upon gallium arsenide and doped gallium arsenide as the active material, can be used to process electronic signals of higher frequencies, such as 10-20 Gigahertz, as well as optical and optoelectronic signals. However, due to power and yield limitations, the gallium arsenide devices cannot achieve the packing densities of the silicon circuits. A number of specialized microelectronic circuits and optical devices are available for processing optical and electrical high frequency signals, and are now in use.

As indicated, silicon-based technologies and gallium arsenide-based technologies each have particular limitations in their application. Some of the limitations, such as the optimal functioning in various frequency ranges, stem from the nature of the materials themselves. As such, it is not expected that the respective limitations could be readily overcome by further development of the particular material.

Hybrid systems have been proposed and constructed to incorporate the most useful characteristics of both silicon-based technologies and gallium arsenide based technologies, in a single apparatus. In such hybrid systems, both silicon-based and gallium arsenide-based active integrated circuits are used, and are placed into a single package. The individual integrated circuits are linked by conductors, such as wires, that are attached to various input and output terminals of the integrated circuits. The linked individual integrated circuits can thereby interact with each other, with signals processed in one circuit used as input to other circuits in complex ways.

While such hybrid systems are operable, they are not optimal in the sense that the necessary long interconnections between devices slow the operation of the system. They also reduce its reliability, and certainly increase its size. The cost of such systems is high due to the low fabrication throughput resulting from the individual processing of devices. There therefore exists a need for improvements to such hybrid systems that overcome these difficulties, while retaining the various advantages of the different technologies.

There have been developments which are potentially useful in meeting this need. Gallium arsenide has been grown as epitaxial layers on bulk silicon single crystals. It is conceivable that hybrid systems could be built up on a single slice of silicon, with some circuits in the silicon and others in the deposited gallium arsenide. However, this result cannot readily be applied practically to making hybrid circuits, as the bulk silicon is a conductor of electricity and cannot provide the needed electrical isolation of the different circuit elements. In addition, the bulk silicon substrate cannot be effectively used for transmission of high frequency signals due to the loss factor associated with its dielectric constant.

There is at present no satisfactory solution for the problem of fabricating hybrid systems that incorporate both high frequency or optoelectronic gallium arsenide technology and high density silicon technology. The need for a compatible approach remains. Ideally, the approach would permit the use of all of the techniques developed for the two technologies in an optimized fashion, yet also permit reduced size and power consumption, and increased speed of operation and reliability. The present invention fulfills this need, and further provides related advantages.

SUMMARY OF THE INVENTION

The present invention is embodied in a process for preparing a monolithic semiconductor heterostructure, which serves as the starting point for fabrication of hybrid systems, a process for preparing hybrid systems therefrom, and the heterostructure and systems themselves. The invention permits the useful features of gallium arsenide technology and silicon technology to be incorporated in a monolithic fashion into a single wafer-scale system on an insulator substrate. The speed and reliability of the system are increased as compared with prior approaches to hybrid systems, while the power consumption and size are decreased. The fabrication can be done by a batch process, leading to high yields and low costs. Once the basic integrated heterostructure is formed, existing fabrication techniques can be used for preparing particular types of devices separately in the device-quality silicon and device-quality gallium arsenide. The approach is highly flexible so that a wide variety of interrelated hybrid circuit designs can be implemented.

In accordance with the invention, a process for preparing a semiconductor heterostructure comprises the steps of furnishing a silicon-on-insulator substrate having a highly perfect silicon layer on an insulator substrate; forming a transition layer of gallium arsenide overlying the silicon layer, the transition layer being deposited at a temperature of less than about 200° C. and then regrown by solid phase epitaxy on the silicon layer; and forming a primary layer of a material selected from the group consisting of gallium arsenide and alloys thereof overlying the transition layer.

In a preferred form, some regions of the substrate have just the silicon deposited thereupon, while others have gallium arsenide deposited overlying the silicon. A microelectronic device can be fabricated in the silicon layer. A separate microelectronic device can be fabricated in the gallium arsenide layer, and the two devices selectively isolated from each other and from other devices and elements by removing portions of the silicon layer extending between the devices to be isolated. The insulator substrate electrically isolates devices deposited thereupon from each other and the surroundings, and also supports the devices. The various devices can be packed closely together on a single chip of the insulator, resulting in reduced size and power consumption and increased speed due to the short lengths of the interconnections between devices. The devices are interconnected, as needed, with metallization procedures commonly used in integrated circuit fabrication. Reliability is increased because separate wiring interconnection procedures are not required.

More specifically, in terms of the processing used, a process for preparing a semiconductor heterostructure comprises the steps of furnishing an insulator substrate of a material selected from the group consisting of aluminum oxide and silicon dioxide; depositing a highly regular silicon layer overlying the insulator substrate, the depositing including the steps of depositing a layer of silicon on the substrate, implanting ions in the layer of silicon, and regrowing the silicon layer by solid state annealing; depositing a transition layer of gallium arsenide overlying the highly regular silicon layer, the depositing including the steps of depositing a transition layer of gallium arsenide on the highly regular silicon layer, the transition layer of gallium arsenide having a thickness of about 200 Angstroms and being deposited at a substrate temperature of about 100° C., and regrowing the transition layer of gallium arsenide by solid state annealing; and depositing a primary layer of a material selected from the group consisting of gallium arsenide and alloys thereof overlying the transition layer, by molecular beam epitaxy at a temperature of about 550° C.

The substrate is furnished as an insulator of the type commonly used, as for example aluminum oxide insulator in common SOI (silicon on insulator) integrated circuits, and specifically the sapphire form of aluminum oxide used in SOS (silicon on sapphire) integrated circuits. Silicon dioxide is another common insulator material, which is often used as deposited on an underlying support. The use of silicon dioxide insulator is particularly convenient in certain applications, as it can be formed by oxidizing previously deposited silicon. Other types of insulators can also be used, with the only limitation that they must permit the formation of silicon single crystal layers thereupon.

The silicon layer is formed by a procedure that ensures it to be of "device quality", in which active silicon devices can be fabricated. The term "device quality", as generally understood in the industry and as used herein, means that the dislocation density of the material is less than about $10^6$ per square centimeter, and that the volume fraction of stacking faults and twins in the material is less than about 1 percent. A preferred approach to ensuring a device quality silicon layer involves use of solid phase epitaxy and regrowth. In this approach, silicon is deposited as a layer of the required thickness, typically about 0.5 micrometers, by an appropriate technique such as chemical vapor deposition. The as-deposited layer contains a high defect density due to the mismatch and chemical differences between the silicon and the underlying insulating substrate, and is not of acceptable device quality. The silicon layer is converted into device quality by implanting silicon ions therein to disrupt the structure and increase its energy, and thereafter regrown to a highly perfect, device quality form.

The gallium arsenide layer is deposited overlying the device quality silicon layer. The gallium arsenide layer must be deposited by a technique that ensures device quality gallium arsenide. Reaching such a quality in the gallium arsenide is difficult, since the mismatch in lattice constants and mismatch in thermal expansion coefficients of the gallium arsenide and silicon are large. A high defect density at the interface between the gallium arsenide and the silicon is expected, in the absence of care to avoid such defects. No prior techniques are known for reliably and reproducibly growing device quality gallium arsenide on silicon-on-insulator substrates.

The preferred approach to depositing the device quality gallium arsenide layer is to first deposit and process a thin transition layer of gallium arsenide adjacent the silicon, and then to add a primary layer of gallium arsenide, or a doped gallium arsenide alloy, overlying the transition layer of gallium arsenide. The transition layer is deposited as a layer of gallium arsenide about 200 Angstroms thick over the silicon at a low temperature of about 100° C. The as-deposited layer is then refined to remove defects by solid phase epitaxy, wherein the crystal structure of the gallium arsenide is grown upwardly from the silicon substrate by solid phase epitaxy to reduce defects. The presence of the transition layer permits the primary gallium arsenide layer to be grown on a high quality, smooth surface, the gallium arsenide transition layer.

The primary layer of gallium arsenide, which layer can be of gallium arsenide or a gallium arsenide-based alloy, is deposited by molecular beam epitaxy at a higher temperature, as about 550° C. The primary layer adopts the same crystallographic orientation as the transition layer, and also its surface morphology and defect structure. The surface morphology is flat, and the defect structure is low, both requirements of a device quality gallium arsenide material, as a result of the solid phase epitaxy regrowth of the transition layer.

Using this heterostructure, a wide variety of electronic devices can be fabricated. The gallium arsenide layer can be made to cover the entire breadth of the silicon layer and the entire breadth of the insulator substrate, so that only gallium arsenide is exposed. Active devices can then be fabricated in the gallium arsenide.

More commonly, the gallium arsenide layers are deposited overlying only a portion of the breadth of the silicon layer. The heterostructure then has exposed on its top surface some regions of device quality silicon, and others of device quality gallium arsenide. Separate electronic devices can be fabricated in each of these regions, and there can be islands of gallium arsenide devices and islands of silicon devices. The individual devices can be made as complex as necessary.

In fabricating devices, the various techniques previously known to fabricate gallium arsenide-based devices and silicon-based devices can be generally used, except that care must be taken to avoid excessive heating that could damage the gallium arsenide that has been previously deposited. It will be appreciated that the heterostructure fabrication steps discussed above can be intermingled with device fabrication steps, in order to avoid temperature-induced damage. For example, most of the fabrication steps of the silicon-based devices may be completed before the gallium arsenide layer is deposited, and fabrication of gallium arsenide-based devices is begun. Such intermingling of heterostructure and device fabrication steps is readily accomplished by the use of cap layers, masking and window techniques to protect previously fabricated structures or areas that might be damaged by subsequent deposition or implantation steps. Examples of this intermingling approach will be presented subsequently.

Interconnections between devices can finally be made by depositing strips of connector materials between the required terminals of the individual devices, a process step termed metallization. The separately fabricated devices are initially linked electrically by the conducting silicon layer, which lies under all of the devices. Either before or after the gallium arsenide layers are added, before or after the individual devices are fabricated, or before or after the metallization is added, the silicon pathways between those devices that are to be electrically isolated are etched away, leaving the individual devices resting upon the insulator substrate.

Thus, a semiconductor heterostructure, comprises an insulator base; a layer of silicon overlying at least a portion of said insulator base; and a layer of gallium arsenide overlying at least a portion of said layer of silicon, the silicon and the gallium arsenide both being of device quality. The insulator base is preferably aluminum oxide, in some form, or silicon dioxide. The term "layer of silicon" includes both pure silicon and alloys or doped forms of silicon. The term "layer of gallium arsenide" includes both gallium arsenide and alloys or doped forms of gallium arsenide.

The heterostructure may be provided without any devices fabricated therein. More commonly, the device fabrication steps are intermingled with the heterostructure fabrication steps of the present invention, because of the considerations of temperature mentioned previously. The semiconductor heterostructures of the invention have properties that are not attainable by any other approach, as device quality gallium arsenide grown on device quality silicon-on-insulator structures has not been previously available.

It will now be appreciated that the present invention provides an important and significant advance in the art of integrated circuit devices. High quality microelectronic devices can be made using gallium arsenide technology and using silicon technology, on a single insulating substrate. The heterostructure permits increased performance of hybrid systems, as for example when the low frequency, digital performance of silicon technology is used to control gallium arsenide devices that manipulate high frequency signals. Other features and advantages of the present invention will be apparent from the following more detailed description, taken in conjunction with the accompanying drawings, which illustrate, by way of example, the principles of the invention.

BRIEF DESCRIPTION OF THE DRAWINGS

FIG. 1 is a general perspective view of a semiconductor heterostructure having different technology devices thereupon;

FIG. 2 is a side sectional view of a portion of the heterostructure of FIG. 1;

FIG. 3 is a flow chart which pictorially depicts the preparation of a heterostructure having devices fabricated thereupon;

FIG. 4 is a circuit diagram of an integrated optoelectronic device;

FIG. 5 is a side sectional view of an optoelectronic device employing hybrid integrated technology, which implements the circuit of FIG. 4;

FIG. 6 is an optoelectronic signal conversion device;

DETAILED DESCRIPTION OF THE PREFERRED EMBODIMENT

Figure 7:
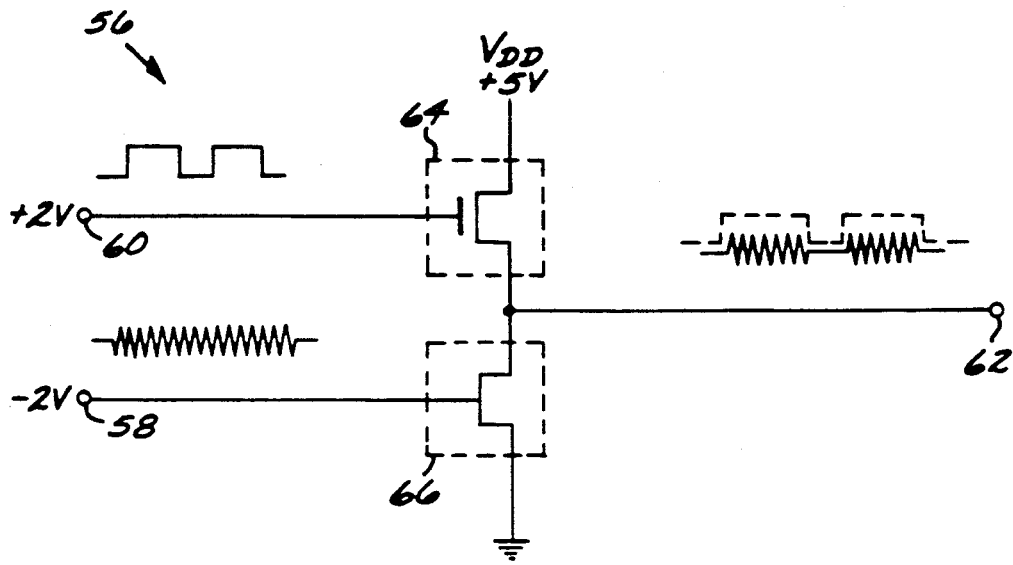
FIG. 7 is a circuit diagram of a hybrid integrated circuit employing low and high frequency devices.

So that the present invention may be placed into context, FIG. 1 illustrates the type of hybrid integrated circuit that can be fabricated with the semiconductor heterostructure of the invention. A hybrid integrated circuit 10 includes a plurality of individual device arrays, including silicon-based technology devices 12 and gallium arsenide-based technology devices 14. The devices 12 and 14 are interconnected to each other with conductors 16, and externally with connectors 18. In reality, the entire integrated circuit 10 may be less than 1 inch on a side, and each of the devices 12 and 14 less than 0.001 inches in size. The present invention is concerned with the approach used to prepare integrated circuits of different technologies on a single chip, and to produce gallium arsenide-based devices on a silicon on insulator substrate.

The preferred construction of a semiconductor heterostructure 20 is illustrated in FIG. 2. The heterostructure 20 includes an insulating substrate 22, preferably of sapphire or silicon dioxide. The thickness of the substrate 22 is typically about 100 micrometers, but this thickness is not critical. Overlying the substrate 22 is a layer 24 of device quality silicon, silicon alloy, or doped silicon. The layer 24 typically has a thickness of about 0.5 micrometers, but this dimension also is not critical.

The layer 24 of silicon is divided laterally into regions by an etched gap 26. The regions are electrically isolated from each other, inasmuch as their only physical connection, except for metallization added at a later stage, is the insulating substrate 22. For reasons that will become apparent, the regions are termed a gallium arsenide device region 28, and a silicon device region 30.

Overlying the portion of the layer 24 that is within the region 28 is a layer 32 of gallium arsenide of device quality. The layer 32 is a single layer, but is divided into two sublayers for the purposes of the disclosure and as a result of the means of formation of the layer 32. However, it should be understood that the two layers are in fact substantially indistinguishable after formed. Immediately overlying the silicon layer 24 is a transition layer 34, having a thickness of about 200 Angstroms. The transition layer 34 provides a transition between the structure of the silicon layer 24, and the structure of the balance of the gallium arsenide layer 32. Overlying the transition layer 34 is a primary layer 36 of gallium arsenide. The primary layer 36 is so named because any subsequently fabricated gallium arsenide device resides principally in the layer 36, which can be of any required thickness but is typically from about 500 Angstroms to about 40 microns thick.

FIG. 3 depicts the process for fabricating a heterostructure of the same type depicted in FIG. 2, but additionally having devices fabricated thereon. A substrate 22 is first provided, as aluminum oxide of the sapphire form, FIG. 3A. The substrate is single crystal sapphire, preferably of an orientation about 4 to 7 degrees off the [100] orientation. The substrate 22 may be any thickness, but is conveniently about 100 micrometers thick.

The silicon layer 24 is deposited overlying the substrate 22, as by chemical vapor deposition. To deposit the layer 24, the substrate is placed into a chemical vapor deposition apparatus and heated to a temperature of about 910° C. A mixture of 100 sccm (standard cubic centimeters per minute) of silane and 100 sccm of hydrogen carrier gas is passed over the substrate, resulting in decomposition of the silane and deposition of silicon onto the substrate 22, FIG. 2B. The thickness of the silicon layer 24 is preferably about 0.5 micrometers. The as-deposited silicon layer 24 is not of device quality, and would not be acceptable for fabrication of silicon-based active devices in the absence of further treatment.

To improve the crystalline quality of the silicon layer 24, the silicon is regrown using a solid phase epitaxial regrowth technique. In the first portion of the regrowth, FIG. 3C, silicon ions are implanted into the silicon layer 24 at an energy of about 250 KEV (thousand electron volts) and a dose of about $6 \times 10^{14}$ ions per square centimeter. The substrate is held at a temperature of about 77° K. The ions of this energy penetrate to a near-interface region 38 of the silicon layer 24, adjacent to the interface between the silicon layer 24 and the substrate 22. The energetic ions further disrupt the crystalline structure of the region 38 and increase its internal energy. A near-surface region 40 portion of the layer 24, above the near-interface region 38, is largely undisturbed by this deep implantation. The substrate 22 and layer 24 are then heated to a temperature of about 600° C., whereupon the disrupted structure of the near-interface region 38 epitaxially regrows on the near-surface region 40 as a seed, resulting in a highly perfect silicon structure in the near-interface region 38.

The perfection of the near-surface region 40 is then improved by a similar process, FIG. 3D. Silicon ions are implanted into the near surface region 40 at an energy of about 75 KEV and a dose of about $8 \times 10^{14}$ ions per square centimeter. The energy of the implanted ions is reduced as compared with the implantation energy in the prior portion of the process, so that the energetic ions penetrate only into the uppermost portion 40 of the layer 24. The temperature is maintained at about 77° K. during the implantation. The crystalline structure of the region 40 is disrupted by these ions. The substrate 22 and the layer 24 are then heated to a temperature of about 600° C., whereupon the disrupted structure of the near-surface region 40 epitaxially regrows on the near-interface region 38 as a seed, resulting in a highly perfect silicon structure in the near-surface region 40. With the completion of this step, the structure of the entire silicon layer 24 has been upgraded to a low-defect, device quality silicon material. Further details of this process and some acceptable alternative processes are disclosed in U.S. Pat. Nos. 4,659,392 and 4,509,990, whose disclosures are herein incorporated by reference.

The gap 26 is next etched in the silicon layer 24, to create islands of silicon that are to become the silicon device regions 30 and the gallium arsenide device regions 28, by conventional etching procedures. These islands and regions are created as necessary in preparation for the fabrication of various types of devices in these regions.

A device is next fabricated in the silicon device region 30, as its fabrication requires temperatures above those permitted for preparation of the gallium arsenide region 28. To protect the gallium arsenide regions 28 during the fabrication of silicon devices in the region 30, the gallium arsenide device regions 28 are masked with a layer of silicon nitride 42, FIG. 3E, which is about 2000 Angstroms thick.

In the approach illustrated, a silicon-based device 12 is fabricated into the silicon layer 24, by an appropriate technique. As depicted in FIG. 3F, the device 12 has not been specified in detail, nor has its method of fabrication, as these are general in nature and not limited to any one type of device.

After the device 12 is fabricated, a layer of silicon nitride 44 is deposited over the silicon device region 30 and the device 12 to protect them during subsequent steps. The silicon nitride layer 42 over the gallium arsenide device region 28 is removed, in preparation for the fabrication of gallium arsenide devices 14.

The preparation of the gallium arsenide layer 32 begins with the deposition of the transition layer 34, FIG. 3G. The transition layer 34 is deposited to a thickness of about 200 Angstroms, overlying the device quality silicon layer 24 by molecular beam epitaxy (MBE) or metal-organic chemical vapor deposition (MOCVD) at a temperature of less than about 200° C. and preferably about 100° C. The transition layer 34 is regrown by solid phase epitaxy on the silicon layer 24, upon subsequent heating for the next step, to be of device quality. The layer 34 is so thin that it cannot be used by itself for the fabrication of devices, but it can serve as the base upon which a thicker, more useful layer of gallium arsenide may be deposited.

The growth of a device quality GaAs layer on a silicon-on-insulator material is significantly different from growth on a bulk silicon wafer. In bulk silicon, there is normally little or no residual stress at the surface of the material. By contrast, in a silicon-on-insulator material, the silicon layer, as grown, is normally strained (due to the different thermal expansion of the silicon and the insulator) as much as 10% or more. Perhaps the most significant consideration in attempting to grow an overlying layer such as GaAs is the need for proper lattice parameter matching of the GaAs to the silicon layer. The residual strains in the silicon layer or the silicon-on-insulator material influence the lattice parameter matching. The residual stresses and strains in the silicon layer of the silicon-on-insulator structure also create lattice defects that adversely affect the performance of the final device product, and this influence must be considered in developing a growth process. The problem of growing a GaAs layer on a silicon-on-insulator substrate is not the same as the problem of growing GaAs on a silicon substrate. In accordance with an important feature of the present invention, the low-temperature deposition of a transition gallium arsenide layer at a low temperature of between about 40° C. to 150° C. permits the thermal expansion and lattice mismatch problems to be avoided, so that the overlying GaAs primary layer may be deposited in epitaxial form.

The primary layer 36 of gallium arsenide of device quality is deposited over the transition layer 34, FIG. 3H. Deposition is accomplished by molecular beam epitaxy or metal-organic chemical vapor deposition at a temperature of about 550° C. The deposited gallium arsenide is of device quality, as it is deposited upon the regrown, highly perfect transition layer 34 and adopts its characteristics and orientation. While the transition layer 34 is unalloyed and undoped gallium arsenide, the primary layer 36 can be gallium arsenide, alloyed gallium arsenide such as GaAlAs, or doped gallium arsenide such as n-doped or p-doped gallium arsenide.

A gallium arsenide-based device 14 is then fabricated in the gallium arsenide layer 32, FIG. 3I. As in the discussion of the device 12, the nature of the device 14 is not limited to any particular type of device based upon gallium arsenide-based technology. After the device 14 is fabricated, the silicon nitride layer 44 on top of the silicon devices is removed.

At this point in fabrication, the devices 12 and 14 are prepared, but are insulated from each other due to the insulating substrate 22 and the gap 26 between the regions 28 and 30. Certain electrical connections are required between the various devices fabricated in the regions 28 and 30, as are external connectors. The conductors 16 are formed by conventional metallization procedures, wherein the metallic conductor 16 is deposited overlying the substrate 22 and leading between the devices. Since these are typically low temperature processes, they can be done conventionally without disturbing either the silicon or the gallium arsenide devices.

As discussed earlier, there can be a wide degree of variation in the details of the fabrication procedures. The processing requirements for fabricating the various devices 12 and 14 may necessitate the use of particular heat exposure and heat treatments, that must be planned so as not to interfere with any subsequent steps that must be accomplished at temperatures not exceeding processing maximum values. The procedure of FIGS. 3 is the presently preferred form of the processing.

There are a large number of applications of the heterostructure of the invention in electronics and optoelectronics, and possibly other fields. FIGS. 4–8 illustrate some such applications, which should be taken as exemplary and not limiting of any aspect of the invention.

An optoelectronic circuit for producing light as a response to an electrical input that acts as a gate is illustrated in FIG. 4, and an implementing structure based upon the heterostructure of the invention is illustrated in FIG. 5. A silicon MOSFET 46 provides the driving current for a gallium arsenide LED/LASER 48 that emits light in response to the current. Both silicon MOSFETs and gallium arsenide LED/LASERs are known, as are the procedures for separately fabricating them, but it has not been known to fabricate both on a single chip. Such a device can be used for general purpose light production, but also finds use as an optical interconnect in three dimensional integrated circuits. The devices 46 and 48 are fabricated upon a sapphire substrate 22 separated by the insulating gap 26. An electrical current conductor 16 between the devices 46 and 48 is formed by metallizing a portion of the gap 26 to connect with the proper elements of the devices 46 and 48. Fabrication of the devices 46 and 48 is accomplished by the method of FIG. 3 as to the heterostructure and by well established technologies as to the device details.

FIG. 6 illustrates another type of heterostructure system wherein a number of gallium arsenide light emitting/detecting sensors 50 are fabricated on one side of a thin, transparent silicon-on-insulator substrate 52. A plurality of silicon MOSFETs 54 are fabricated on the other side of the substrate 52, generally oppositely disposed from the sensors 50. Light energy incident upon the sensors 50 is converted to electrical signals in the MOSFETs 54, which can be monitored to map the spatial intensity of the incident light energy. The heterostructure required for such devices is fabricated as described herein, and the individual devices are fabricated by established techniques.

The structures of FIGS. 4–6 have related to optoelectronic devices and the ability of gallium arsenide devices to produce or measure light. The heterostructure of the invention also finds application in purely electronic devices. FIG. 7 shows an electrical circuit diagram of a modulator switching circuit 56, used to modulate a high frequency signal 58 with a low frequency control signal 60, to produce an output signal 62. The circuit 56 includes a silicon-based technology NMOS/FET 64 (n-doped metal oxide semiconductor/field effect transistor) that controls the low frequency signal 60, and a gallium arsenide-based technology MESFET 66 (metal semiconductor field effect transistor) that processes the high frequency signal 58.

Figure 8:
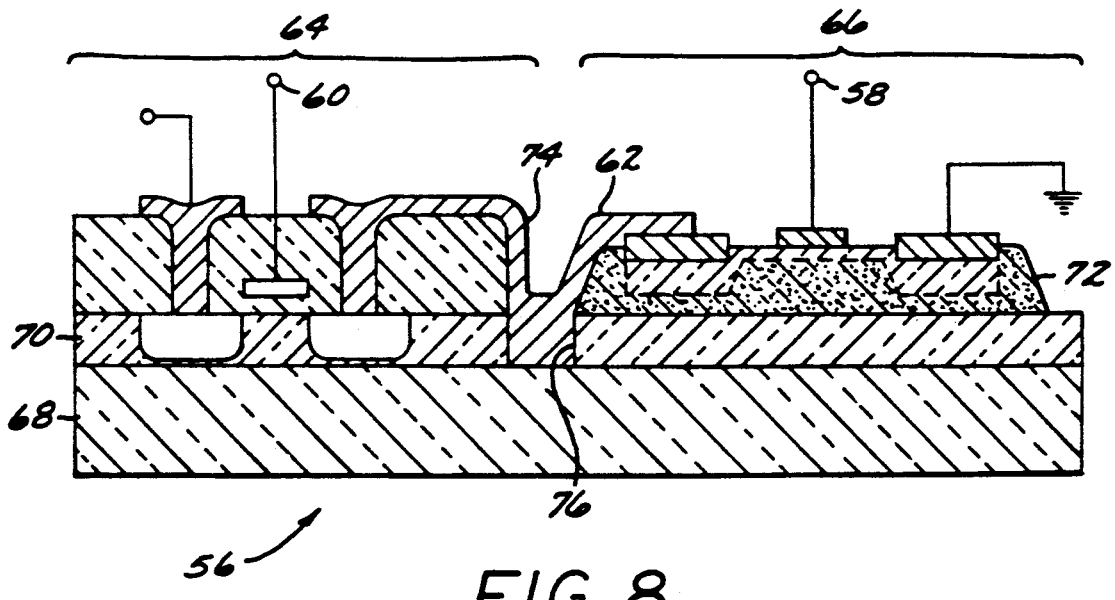
FIG. 8 is a side sectional view of an electronic device employing hybrid integrated circuit technology, which implements the circuit of FIG. 7.

The heterostructure circuit 56 that implements the circuit of FIG. 7 is illustrated in FIG. 8. The heterostructure circuit 56 includes a sapphire substrate 68 and an overlying layer 70 of device quality silicon. A layer 72 of device quality gallium arsenide overlies a portion of the layer 70 of silicon. The NMOS/FET 64 is fabricated into and on the silicon layer 70, and the MESFET 66 is fabricated into the overlying gallium arsenide layer 72. The devices 64 and 66 are connected with a metallization strip 74, but are otherwise electrically isolated from each other by a gap 76.

The heterostructure circuit 56 is fabricated according to the principles set forth previously. The silicon layer 70 is deposited upon the substrate 68 and epitaxially regrown to achieve device quality silicon therein. The gallium arsenide layer 72 is deposited upon a portion of the silicon layer 70 by first depositing a transition layer and then a primary layer of gallium arsenide, which gallium arsenide layer 72 is of device quality. Interspersed with these steps are the steps of fabricating the devices 64 and 66 in the silicon layer 70 and the gallium arsenide layer 72, respectively.

It will be apparent that the heterostructure combining gallium arsenide and silicon on insulator technologies provides an important advance in semiconductor technology, by permitting gallium arsenide and silicon devices to be fabricated together on an insulating chip. Although a particular embodiment of the invention has been described in detail for purposes of illustration, various modifications may be made without departing from the spirit and scope of the invention. Accordingly, the invention is not to be limited except as by the appended claims.

What is claimed is:

1. A process for preparing a semiconductor heterostructure, comprising the steps of:
    furnishing a silicon-on-insulator substrate having a device quality silicon layer on an insulator substrate;
    forming a transition layer of gallium arsenide directly on the silicon layer, the transition layer being deposited at a temperature of about 40° C. to about 100° C. and then regrown by solid phase epitaxy on the silicon layer; and
    forming a primary epitaxial layer of a material selected from the group consisting of gallium arsenide and alloys thereof directly on the transition layer.

2. The process of claim 1, wherein the insulator substrate is a material selected from the group consisting of $Al_2O_3$ and $SiO_2$.

3. The process of claim 1, wherein the transition layer is about 200 Angstroms thick.

4. The process of claim 1, wherein the primary layer is formed by deposition using molecular beam epitaxy.

5. The process of claim 1, wherein the primary layer is from about 100 Angstroms to about 50 micrometers thick.

6. The process of claim 1, including the further step of forming a microelectronic device in the primary layer.

7. The process of claim 1, wherein the transition layer and the primary layer are deposited over only a portion of the surface of the silicon-on-insulator substrate, resulting in an exposed silicon surface and an exposed primary layer surface.

8. The process of claim 7, including the further step of
forming a silicon-based microelectronic device in the exposed silicon portion, and
forming a gallium arsenide-based microelectronic device in the primary layer.

9. A process for preparing a semiconductor heterostructure, comprising the steps of:
furnishing an insulator substrate of a material selected from the group consisting of aluminum oxide and silicon dioxide;
depositing a device quality silicon layer overlying the insulator substrate, said depositing including the steps of
depositing a layer of silicon on the substrate,
implanting ions in the layer of silicon, and
regrowing the silicon layer by solid state annealing;
depositing a transition layer of gallium arsenide on the device quality silicon layer, said depositing including the steps of
depositing a transition layer of gallium arsenide directly on the device quality silicon layer, the transition layer of gallium arsenide having a thickness of about 200 Angstroms and being deposited at a substrate temperature of about 40° C. to about 100° C.;
regrowing the transition layer of gallium arsenide by solid state annealing; and
depositing a primary layer of a material selected from the group consisting of gallium arsenide and alloys thereof directly on the transition layer, by molecular beam epitaxy at a temperature of about 550° C.

10. The process of claim 9, including the further step of
forming a microelectronic device in the primary layer.

11. The process of claim 9, wherein the transition layer and the primary layer are deposited over only a portion of the surface of the silicon-on-insulator substrate, resulting in an exposed silicon surface and an exposed primary layer surface.

12. The process of claim 11, including the further step of
forming a silicon-based microelectronic device in the exposed silicon portion, and
forming a gallium arsenide-based microelectronic device in the primary layer.

* * * * *